US012727506B2

(12) United States Patent
Hsu et al.

(10) Patent No.: US 12,727,506 B2
(45) Date of Patent: Sep. 1, 2026

(54) CHIP PACKAGE STRUCTURE AND METHOD FOR PRODUCING THE SAME

(71) Applicant: TONG HSING ELECTRONIC INDUSTRIES, LTD., Taoyuan City (TW)

(72) Inventors: Jui-Hung Hsu, Taoyuan City (TW); Yu-Wen Li, Taoyuan City (TW); Li-Chun Hung, Taoyuan City (TW)

(73) Assignee: TONG HSING ELECTRONIC INDUSTRIES, LTD., Taoyuan City (TW)

( * ) Notice: Subject to any disclaimer, the term of this patent is extended or adjusted under 35 U.S.C. 154(b) by 222 days.

(21) Appl. No.: 18/777,513

(22) Filed: Jul. 18, 2024

(65) Prior Publication Data

US 2024/0371820 A1 Nov. 7, 2024

Related U.S. Application Data

(63) Continuation-in-part of application No. 18/526,100, filed on Dec. 1, 2023, which is a continuation-in-part (Continued)

(30) Foreign Application Priority Data

Oct. 21, 2022 (TW) ................................ 111139939
Oct. 17, 2023 (TW) ................................ 112139543

(51) Int. Cl.
*H10W 76/60* (2026.01)
*H10F 39/00* (2025.01)
(Continued)

(52) U.S. Cl.
CPC ........... *H10W 76/60* (2026.01); *H10F 39/804* (2025.01); *H10W 72/013* (2026.01); *H10W 72/0198* (2026.01); *H10W 72/07302* (2026.01); *H10W 72/07331* (2026.01); *H10W 72/331* (2026.01); *H10W 72/865* (2026.01); *H10W 74/124* (2026.01); *H10W 90/734* (2026.01); *H10W 90/754* (2026.01)

(58) Field of Classification Search
CPC .......................... H10F 39/011; H10W 72/071
See application file for complete search history.

(56) References Cited

U.S. PATENT DOCUMENTS

2020/0350357 A1* 11/2020 Hung .................... H10F 39/011

* cited by examiner

*Primary Examiner* — Yu-Hsi D Sun
(74) *Attorney, Agent, or Firm* — Li & Cai Intellectual Property Office

(57) ABSTRACT

A chip package structure and a method for producing the same are provided. The method at least includes: providing a substrate; placing a chip upside-down on the substrate; forming bonding wires coupled with the chip and the substrate; providing at least one reflecting member on an upper surface of the substrate, forming a support body on the substrate to cover the at least one reflecting member; providing a package cover adhered to the support body by a glass adhesive; performing a solidifying process in which a solidifying light beam is emitted to the reflecting member and the reflecting member reflects the solidifying light beam to the glass adhesive to solidify the glass adhesive; performing a packaging process in which a package body is formed to cover an edge surface of the package cover and a top part of the support body.

16 Claims, 15 Drawing Sheets

Related U.S. Application Data of application No. 18/184,976, filed on Mar. 16, 2023, now Pat. No. 12,598,821.

(51) Int. Cl.

| | |
|---|---|
| *H10W 72/00* | (2026.01) |
| *H10W 72/30* | (2026.01) |
| *H10W 74/10* | (2026.01) |
| *H10W 90/00* | (2026.01) |

CHIP PACKAGE STRUCTURE AND METHOD FOR PRODUCING THE SAME

CROSS-REFERENCE TO RELATED PATENT APPLICATION

This application is a continuation-in-part of the U.S. patent application Ser. No. 18/526,100, filed on 1 Dec. 2023, which is a continuation-in-part of the U.S. patent application Ser. No. 18/184,976, filed on Mar. 16, 2023, and entitled "CHIP PACKAGE STRUCTURE AND METHOD FOR PRODUCING THE SAME," now pending, the entire disclosures of which are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure and method for producing the same, and more particularly to a chip package structure having a support body made of photo-curable glue and method for producing the same, and the support body of the chip package structure is solidified by a solidifying light beam.

BACKGROUND OF THE DISCLOSURE

In a conventional method for producing a chip package structure, a special photo-curable glue (e.g., an ultraviolet glue) may be used, and the photo-curable glue needs to be solidified by an ultraviolet light beam. For example, a complementary metal-oxide-semiconductor (CMOS) sensor die has a glass cover at a top side thereof, and the glass cover is disposed on a substrate through the photo-curable glue. The photo-curable glue airtightly surrounds an outer periphery of a sensing chip as a supporting fence structure for the sending chip. However, in a practical producing method, in order to prevent a flare issue from occurring, a black light-absorbing layer is added on the glass cover to block light beams, but adding the black light-absorbing layer causes the photo-curable glue to be unable to be solidified by the ultraviolet light beam.

Therefore, how to improve on the producing method to increase a production efficiency of the chip package structure and overcome the above-mentioned inadequacy has become an issue to be addressed in this technical field.

SUMMARY OF THE DISCLOSURE

In response to the above-referenced technical inadequacy, the present disclosure provides a chip package structure and method for producing the same.

In one aspect, the present disclosure provides a method for producing a chip package structure. The method at least includes the following steps: providing a substrate; providing a chip and placing the chip upside-down on the substrate; forming a plurality of bonding wires coupled with a plurality of conduct portions of the chip and a plurality of substrate pads of the substrate; providing at least one reflecting member on an upper surface of the substrate, and surrounding an outer periphery of the chip; forming a support body on an upper surface of the substrate, the support body covering the at least one reflecting member; providing a package cover adhered to the support body by a glass adhesive; performing a solidifying process in which a solidifying light beam is emitted to the reflecting member and the reflecting member is utilized to reflect the solidifying light beam to the glass adhesive to solidify the glass adhesive; performing a packaging process in which a package body is formed to cover an edge surface of the package cover and a top part of the support body.

In another aspect, the present disclosure provides a chip package structure. The chip package structure includes a conductive substrate, a plurality of bonding wires, at least one reflecting member, a support body, and a package cover. The conductive substrate includes a substrate having an upper surface, and a chip placed upside-down on the upper surface of the substrate. The bonding wires are coupled with a plurality of conduct portions of the chip and a plurality of pads of the substrate. The at least one reflecting member is disposed on an upper surface of the substrate, and surrounds an outer periphery of the chip. The support body is formed on the upper surface of the substrate and covers the at least one reflecting member. The package cover is adhered to of the support body by a glass adhesive. The glass adhesive undergoes a solidifying process in which a solidifying light beam is reflected by the at least one reflecting member to the glass adhesive to solidify the glass adhesive.

Therefore, in the chip package structure and method for producing the same provided by the present disclosure, by performing a solidifying process in which a solidifying light beam is emitted to the reflecting member and the reflecting member is utilized to reflect the solidifying light beam to the glass adhesive to solidify the glass adhesive," a method for producing a chip package structure can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
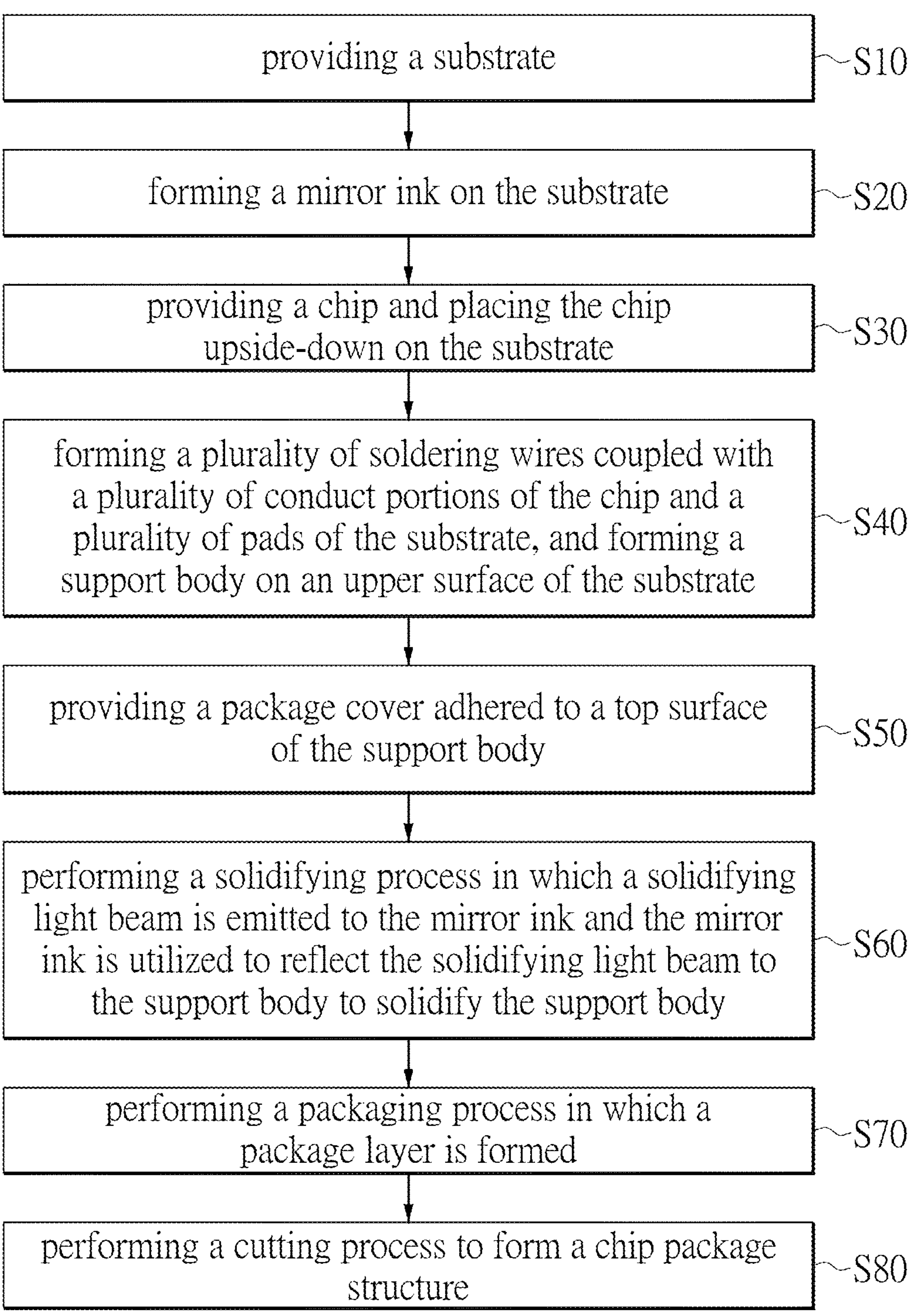
FIG. 1 is a flowchart of a method for producing a chip package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
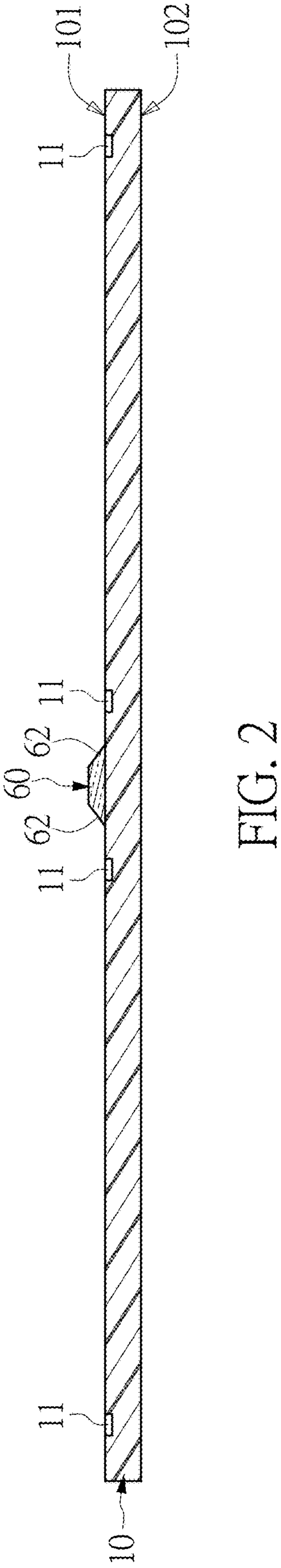
FIG. 2 is a schematic view of a mirror ink formed on the substrate according to the first embodiment of the present disclosure.

Referring to FIG. 1, a first embodiment of the present disclosure provides a method for producing a chip package structure, each step of the method is described in the following description with reference to the schematic figures. Firstly, as shown in FIG. 2, a step S10 is implemented by providing a substrate 10. A material of the substrate 10 can be ceramic, but the present disclosure is not limited thereto. The substrate 10 has an upper surface 101 and a lower surface 102. The substrate 10 has a plurality of substrate pads 11 formed on the upper surface 101 thereof.

Referring to FIG. 2, a step S20 is implemented by forming a mirror ink 60 on the substrate 10. A material of the mirror ink 60 preferably is ultraviolet resistant and has a high reflective rate. Specifically, the mirror ink 60 includes a plurality of metal particles or metal sheet structures configured to reflect a light beam or an ultraviolet light beam. The mirror ink 60 can be formed on the substrate 10 by printing, coating, or spraying. The function of the mirror ink 60 is treated as a reflecting member. However, the reflecting member of the present disclosure is not limited thereto. Another embodiment will be described in detail later.

Figure 3:
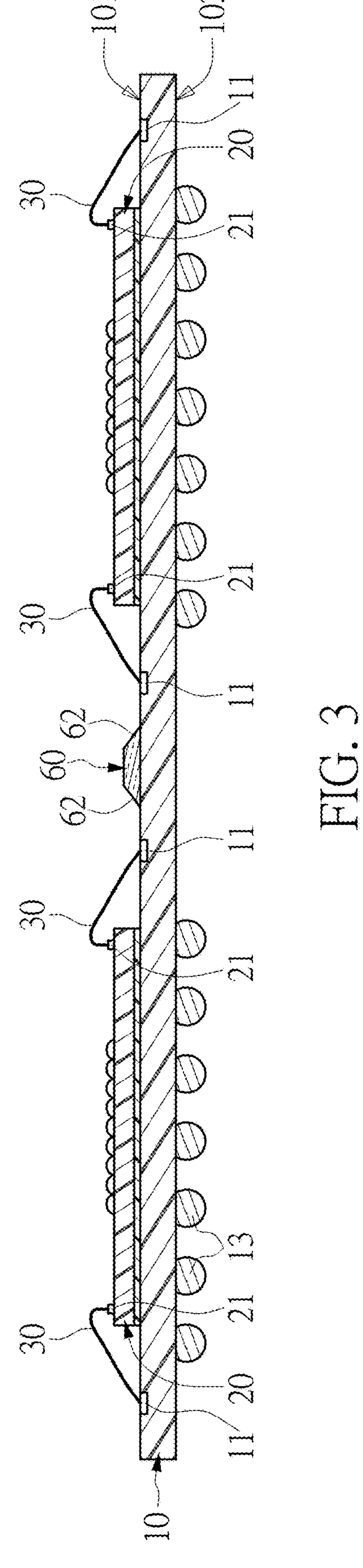
FIG. 3 is a schematic view of a chip placed upside-down according to the first embodiment of the present disclosure.

Referring to FIG. 3, a step S30 is implemented by providing a chip 20 and placing the chip 20 upside-down on the substrate 10. Specifically, the chip 20 is adhered to the upper surface 101 of the substrate 10. For example, the chip 20 can be an image sensor die having a photosensitive portion at a top surface thereof. For example, the chip 20 can be a complementary metal-oxide-semiconductor (CMOS) sensor die, but the present disclosure is not limited thereto. The present disclosure is applicable to any chip package structure that requires an ultraviolet light beam to solidify a support body. The substrate 10 and the chip 20 can be regarded as a conductive substrate.

It should be noted that, in the present embodiment, the lower surface 102 of the substrate 10 can have a plurality of solder balls 13.

A step S40 is implemented by forming a plurality of bonding wires 30 coupled with a plurality of conduct portions 21 of the chip 20 and a plurality of substrate pads 11 of the substrate 10. Specifically, the bonding wires 30 connect the conduct portions 21 of the chip 20 and the substrate pads 11 of the substrate 10.

Referring to FIG. 3, the step S40 is further implemented by forming a support body 40 on the upper surface 101 of the substrate 10. A material of the support body 40 can be a photo-curable adhesive (e.g., a UV curable adhesive). The support body 40 surrounds an outer periphery of the chip 20 to form an enclosed shape. The support body 40 of this embodiment is a black opaque adhesive.

It should be noted that, a shape of the mirror ink 60 can correspond to a shape of the support body 40, and the step S20 of the present embodiment in which the mirror ink 60 is formed can be implemented by forming the mirror ink 60 having an enclosed shape to surround the outer periphery of the chip 20, but the present disclosure is not limited thereto. A shape of the mirror ink 60 can be linear or curved.

Figure 4:
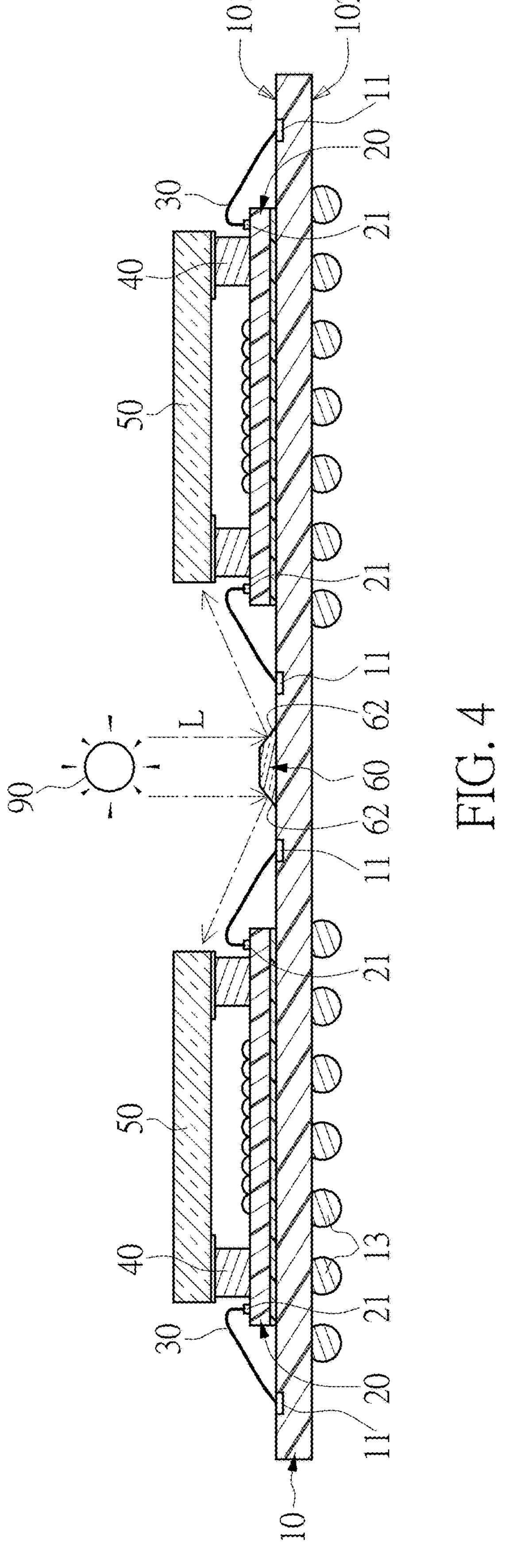
FIG. 4 is a schematic view of a solidifying process according to the first embodiment of the present disclosure.

Referring to FIG. 4, a step S50 is implemented by providing a package cover 50 adhered to a top surface of the support body 40. A material of the package cover 50 can be a transparent glass.

Referring to FIG. 4, a step S50 is implemented by performing a solidifying process in which a solidifying light beam L is emitted by a light source 90 to the mirror ink 60, and the mirror ink 60 is utilized as a reflecting member to reflect the solidifying light beam L to the support body 40 so as to solidify the support body 40. It should be noted that, in the step 20 of the present embodiment in which the mirror ink 60 is formed, at least one mirror slope 62 is formed on the mirror ink 60. Specifically, a cross-sectional surface of the mirror ink 60 is substantially trapezoidal, and the mirror ink 60 includes two mirror slopes 62 respectively facing toward the support bodies 40 that are located at two sides of the mirror ink 60. Each of the mirror slopes 62 can reflect the solidifying light beam L to the support body 40, but the present disclosure is not limited thereto. The cross-sectional surface of the mirror ink 60 can be triangular or arced. In addition, the position of the reflecting member is not limited to the above embodiment. The reflecting member can be disposed at a peripheral position of the support body 40 where the reflecting member is able to reflect the solidifying light beam L to the support body 40.

Figure 5:
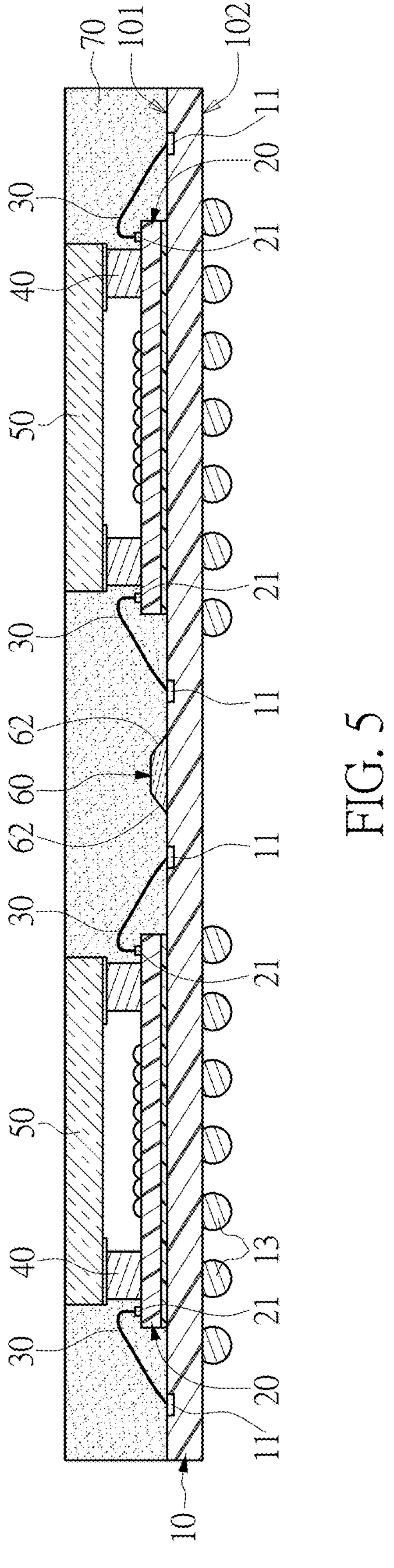
FIG. 5 is a schematic view showing a package layer being formed according to the first embodiment of the present disclosure.

Referring to FIG. 5, a step S70 is implemented by performing a packaging process in which a package layer 70 is formed to cover the chip 20, an outer periphery of the support body 40, and the package cover 50, and the package layer 70 does not completely cover an exposed surface of the package cover 50.

Figure 6:
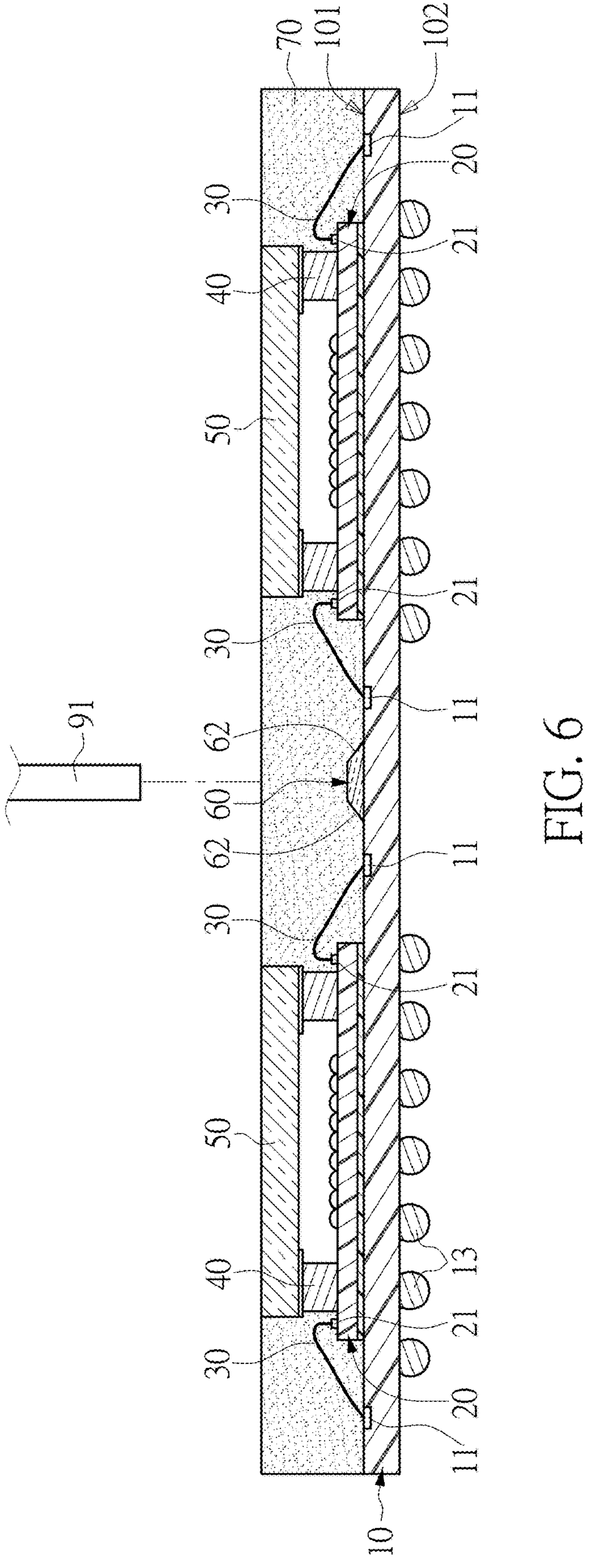
FIG. 6 is a schematic view of a cutting process according to the first embodiment of the present disclosure.
Figure 7:
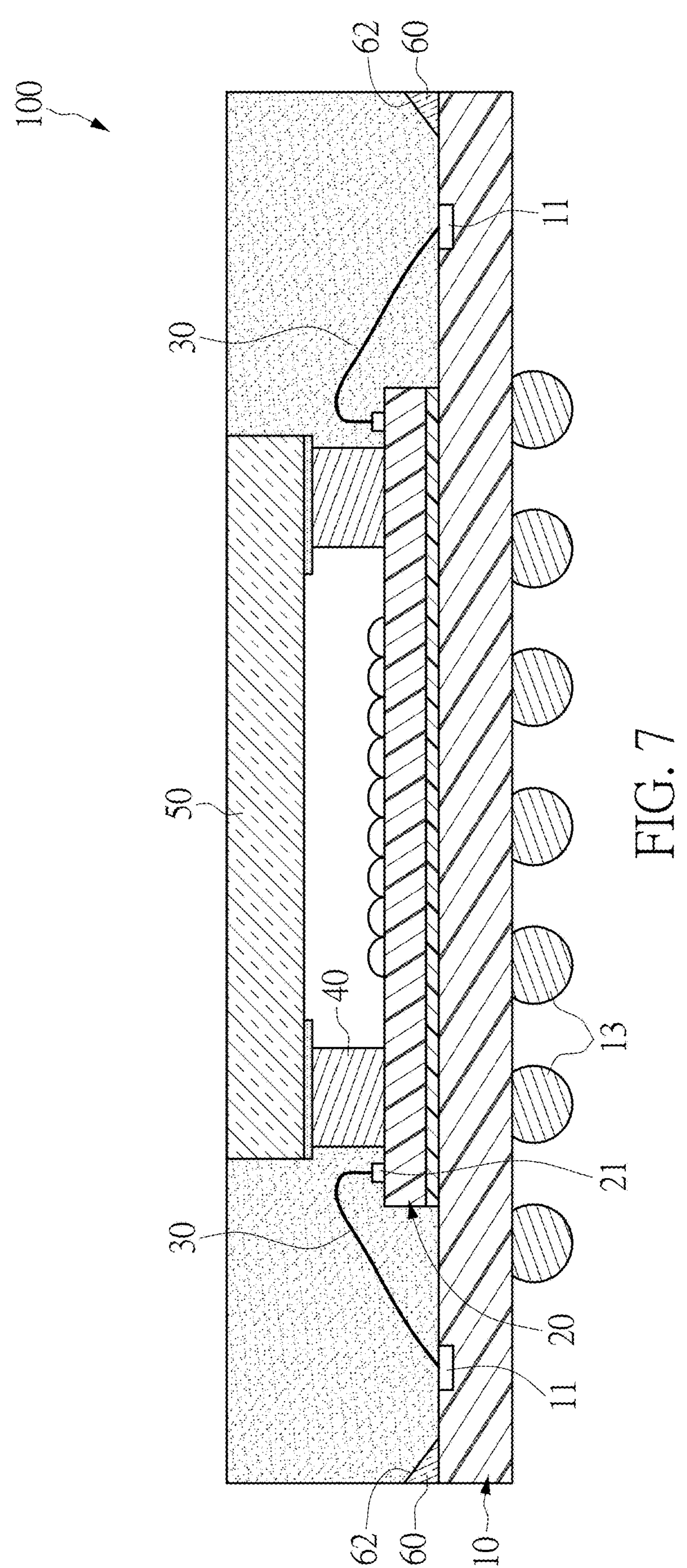
FIG. 7 is a schematic cross-sectional view of the chip package structure according to the first embodiment of the present disclosure.

Finally, as shown in FIG. 6, a step S80 is implemented by performing a cutting process in which a cutting knife 91 is used to cut the package layer 70 and the substrate 10 along the mirror ink 60 to form a chip package structure 100. Referring to FIG. 7, a width of the mirror ink 60 is greater than or equal to a thickness of the cutting knife 91 in the cutting process. After the substrate 10 is cut, parts of the mirror ink 60 remain at an edge of the upper surface 101 of the substrate 10.

It should be noted that, in the present embodiment, a quantity of the chips 20 is two, and the mirror ink 60 is disposed between the two chips 20. When an outer side of each of the two chips 20 is not blocked by other objects, the light source 90 can emit the solidifying light beam L directly to the support body 40 along a horizontal direction. In a practical producing process, a plurality of the chips 20 can be disposed on the substrate 10. Correspondingly, the mirror ink 60 can be arranged at an outer periphery of the chips 20 in a lattice shape or a mesh shape.

Second Embodiment

Figure 8:
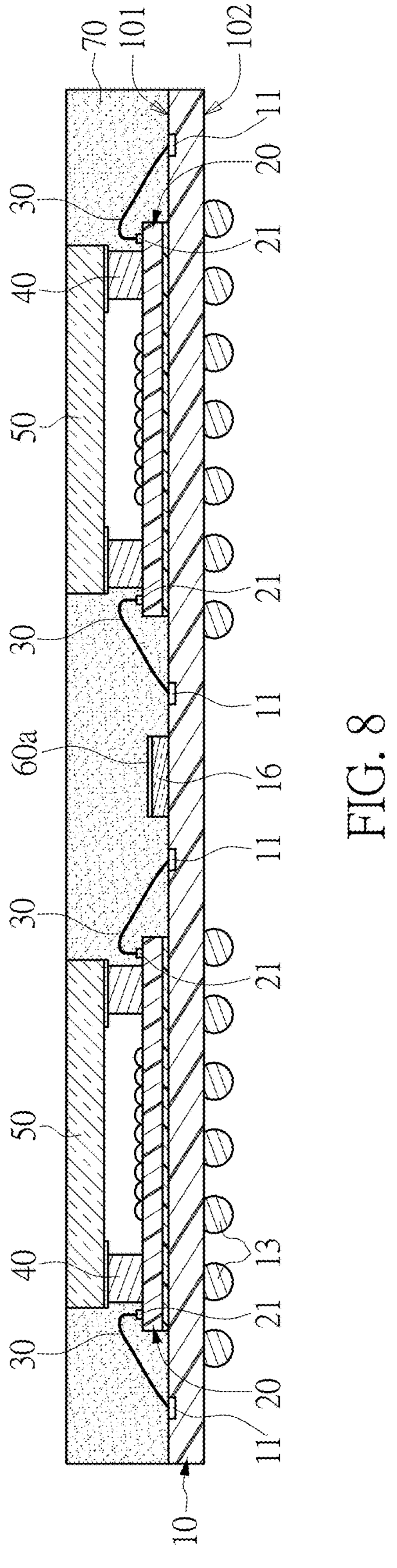
FIG. 8 is a schematic view of a method for producing a chip package structure according to a second embodiment of the present disclosure.

Referring to FIG. 8, the difference between the present embodiment and the first embodiment is as follows. The substrate 10 has a solder resist portion 16 on the upper surface 101 thereof, and a mirror ink **60*a* is formed on the solder resist portion 16. The solder resist portion 16 can be, for example, a solder resist layer, a solder resist ink, or a solder mask on a circuit board. Specifically, in the method for producing the chip package structure of the present embodiment, the solder resist portion 16 is formed on the substrate 10 by printing a solder resist material. A thickness of the solder resist portion 16 is from 0.8 mils to 1.8 mils. In other words, the solder resist portion 16 is 0.8 mils to 1.8 mils higher than the upper surface 101 of the substrate 10**.

It should be noted that, in the solidifying process of the step S60 of the present embodiment, the solidifying light beam L is not necessarily perpendicular to the upper surface 101 of the substrate 10. For example, the solidifying light beam L can be inclined to the upper surface 101 of the substrate 10. A shape of a cross-sectional surface of the solder resist portion 16 is not limited to a shape as shown in FIG. 8, and can be triangular, trapezoidal, or arced. An advantageous effect of the present embodiment is that a usage amount of the mirror ink can be saved.

Third Embodiment

Figure 9:
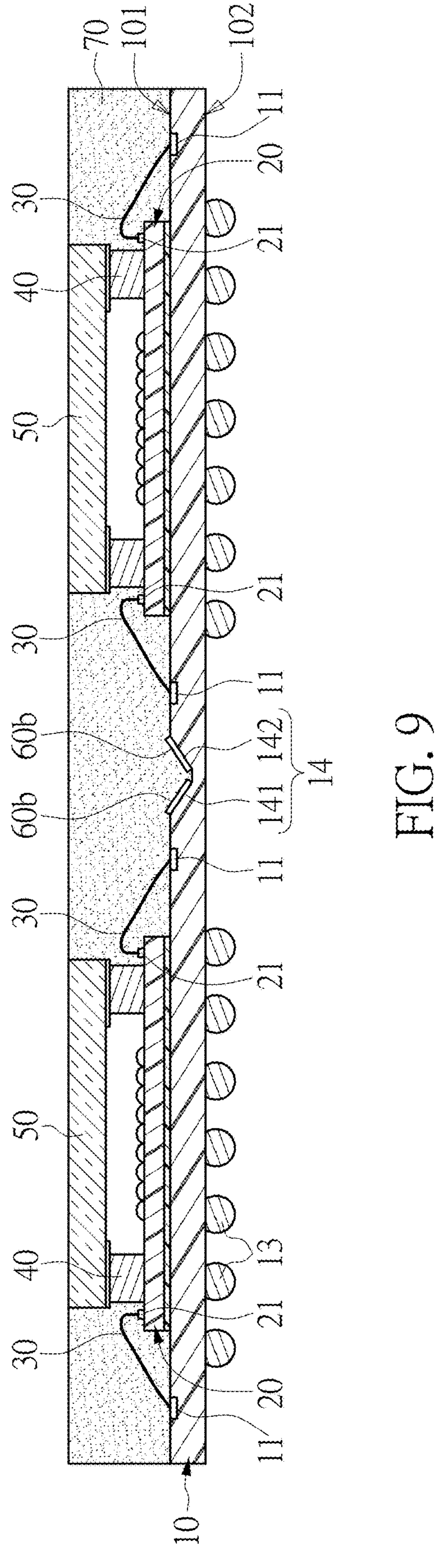
FIG. 9 is a schematic view of a method for producing a chip package structure according to a third embodiment of the present disclosure.

Referring to FIG. 9, the difference between the present embodiment and the first embodiment is as follows. A solder resist recess 14 is formed on the substrate 10, and a mirror ink **60*b* is formed on a surface of the solder resist recess 14. Specifically, the method for producing the chip package structure of the present embodiment further includes a step implemented by forming at least one concave slope 142 at the solder resist recess 14, the concave slope 142 is lower than the upper surface 101 of the substrate 10, and the mirror ink 60*b* is formed on the concave slope 142. In the present embodiment, the solder resist recess 14 has two concave slopes 141, 142 that respectively correspond to the support bodies 40 of the chip package structures at two sides of the solder resist recess 14. In the solidifying process of the present embodiment, the mirror ink 60*b* on the concave slope 141 at the left can reflect the solidifying light beam to the support body 40 at the right, and the mirror ink 60*b* on the concave slope 142 at the right can reflect the solidifying light beam to the support body 40 at the left. An advantageous effect of the present embodiment is that, the solder material and the usage amount of the mirror ink can be saved. The cross-sectional surface of the solder resist portion 14** is not limited in the present disclosure, and can be in other shapes (e.g., an arced shape).

It should be noted that, the present disclosure can mix the above-mentioned embodiments in the method for producing the chip package structure.

Fourth Embodiment

Referring to FIG. 10 to FIG. 13, the reflecting member of the present disclosure can be a metal piece 23. The metal piece 23 can be a metal bump or a metal ball with good reflective effect, and is disposed at a periphery of the support body 40 for reflecting the solidifying light beam L to the support body 40, so as to solidify the support body 40.

Figure 10:
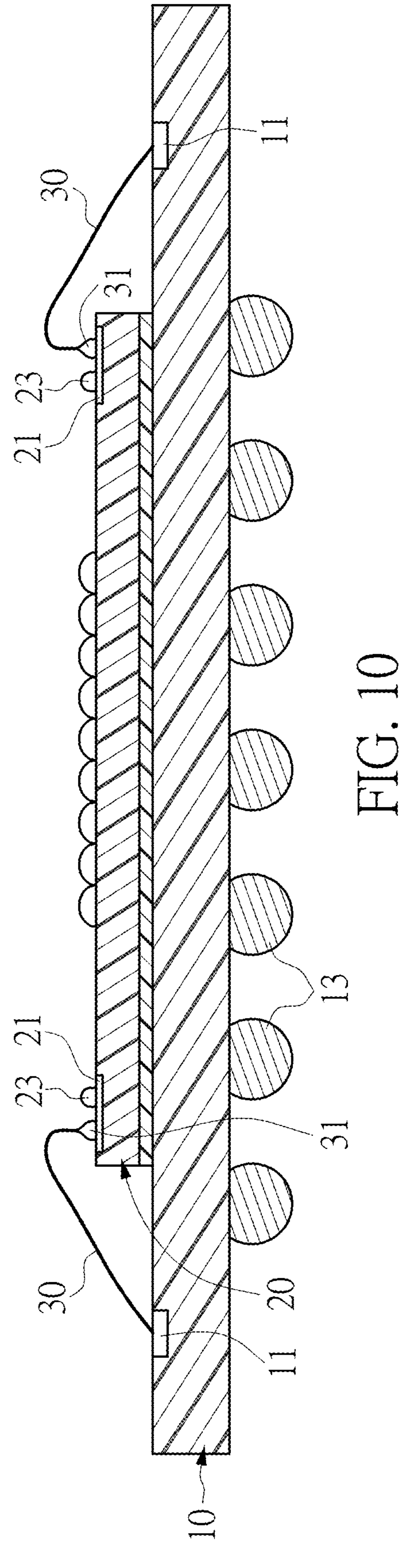
FIG. 10 is a schematic view of a reflecting member formed on the substrate according to a fourth embodiment of the present disclosure.

Referring to FIG. 10, specifically, there are a plurality of metal pieces 23 to be regarded as reflecting member, which are disposed at the periphery of the support body 40. For example, the metal piece 23 is disposed on a top surface of the conduct portion 21 of the chip 20, and is adjacent to a gold ball 31 at one end of the gold bonding wire 30. The material of the metal piece 23 can be gold which is the same as that of the gold bonding wire 30, and is a gold ball or a gold bump. The metal piece 23 can be separated away from the gold ball 31. The metal piece 23 provides more reflecting surface facing the support body 40. However, the present disclosure is not limited thereto. The metal piece 23 can be connected with the gold ball 31. For example, during a wire bonding process, a ball-shaped metal piece 23 is further formed simultaneously. In addition, the metal piece 23 can be formed at another place of the surface of the chip 20. The metal piece 23 can be a flake gold foil. Furthermore, the metal piece 23 is not limited to be made of gold, for example, it can be copper or silver.

Figure 11:
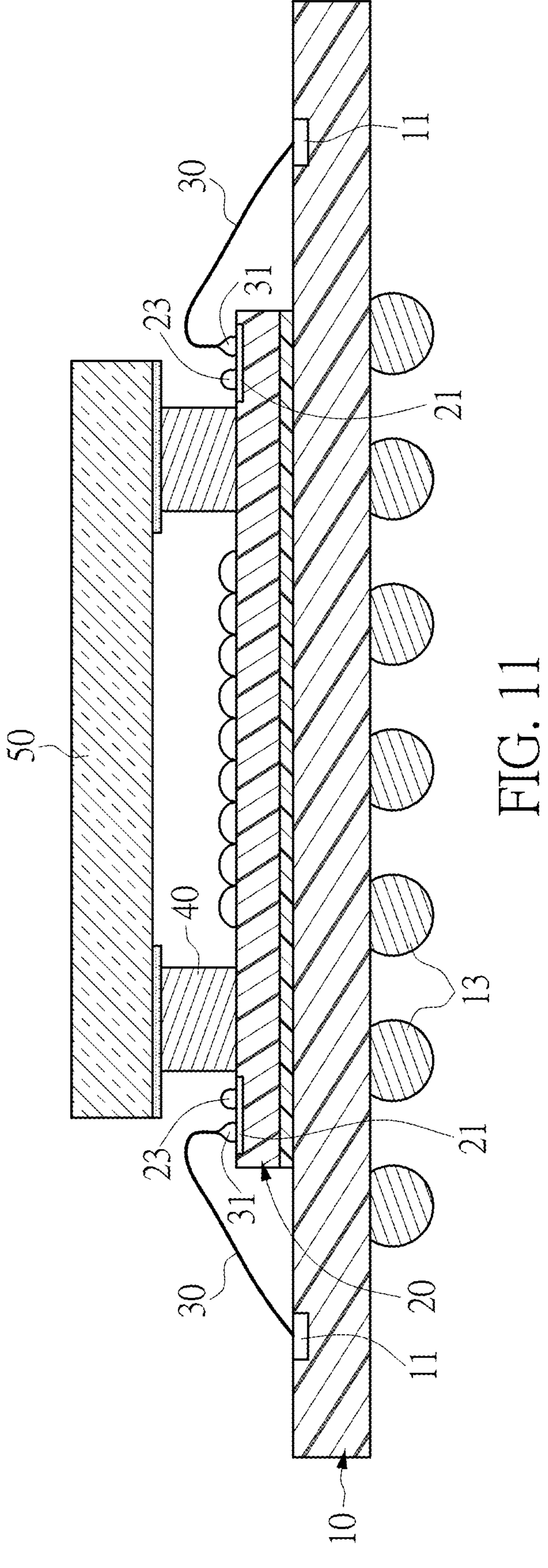
FIG. 11 is a schematic view of a support body and a package cover formed on the chip according to the fourth embodiment of the present disclosure.

Referring to FIG. 11, the package cover 50 is adhered to a top surface of the support body 40. In an embodiment, a periphery of the package cover 50 is not extended above the metal piece 23. Thus, the solidifying light beam L can be reflected to the support body 40.

Figure 12:
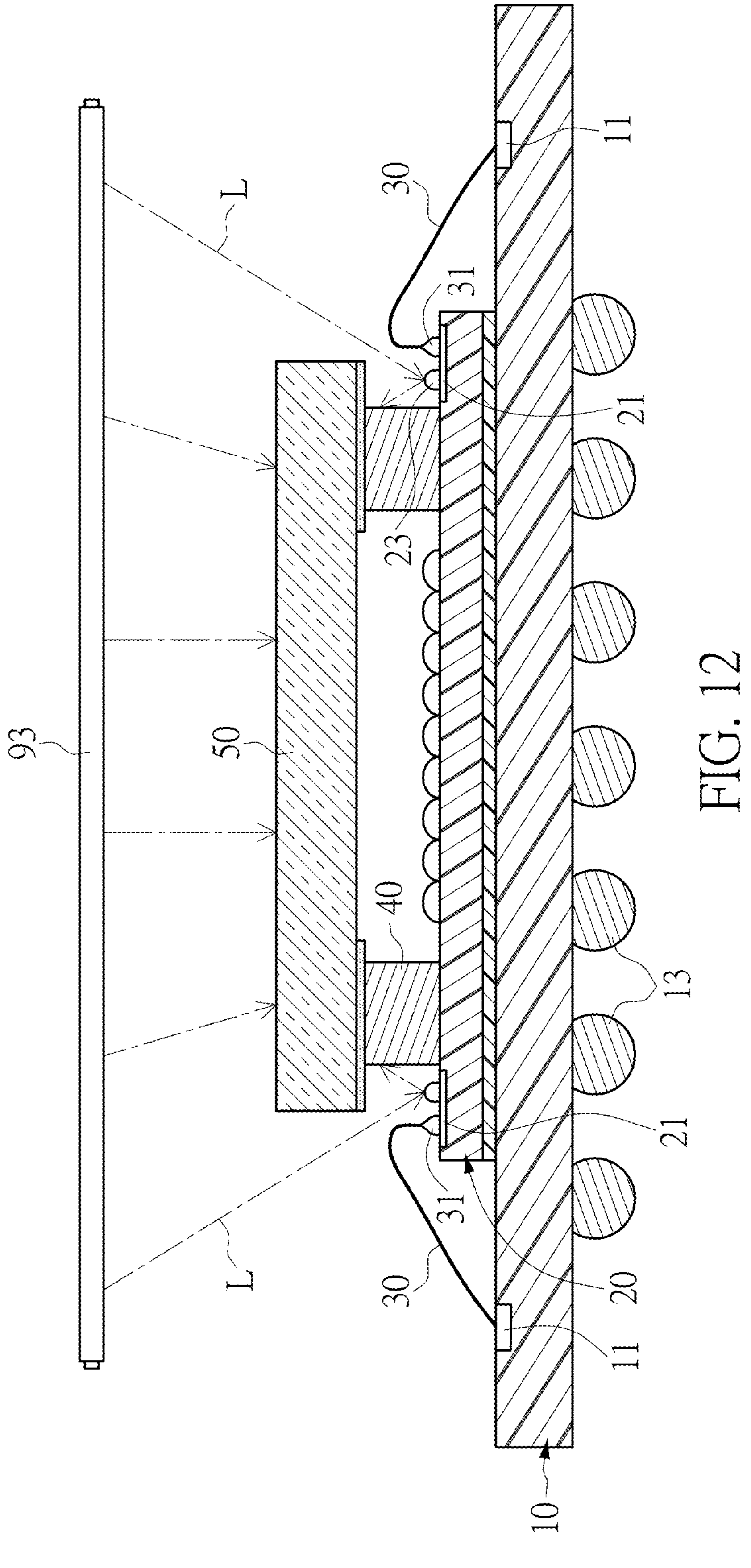
FIG. 12 is a schematic view of a solidifying process according to the fourth embodiment of the present disclosure.

Referring to FIG. 12, a solidifying process is performed. A light source 93 is provided above the package cover 50 to emit the solidifying light beam L to the metal piece 23. The metal piece 23 is utilized as a reflecting member to reflect the solidifying light beam L to the support body 40, so that more solidifying light beam L can be emitted to the surface of the support body 40 to increase the curing rate of the support body 40. Therefore, the delamination problem can be reduced.

Figure 13:
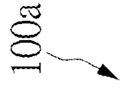
FIG. 13 is a schematic cross-sectional view of the chip package structure according to the fourth embodiment of the present disclosure.
Figure 13:
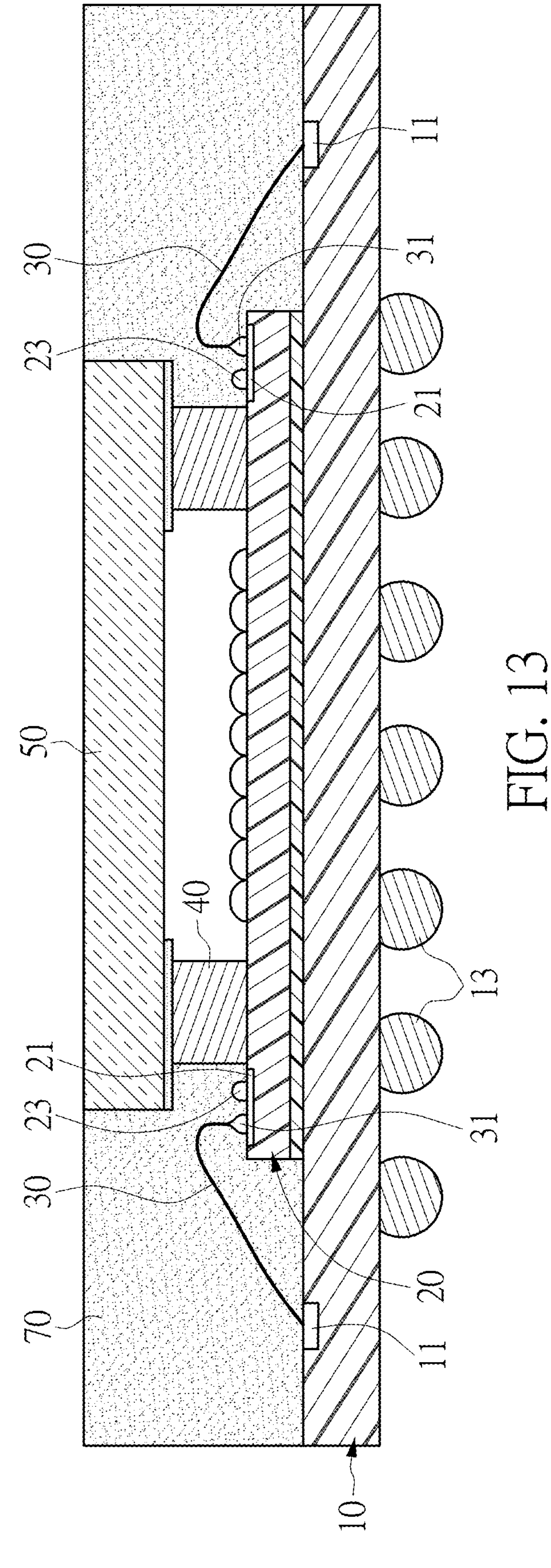

Referring to FIG. 13, a packaging process is performed, and a package layer 70 is formed to cover the chip 20, an outer periphery of the support body 40, and the package cover 50. After this packaging process is finished, the metal pieces 23 are still remained on the top surface of the chips 20, so as to form a chip package structure 100*a*.

Fifth Embodiment

Figure 14:
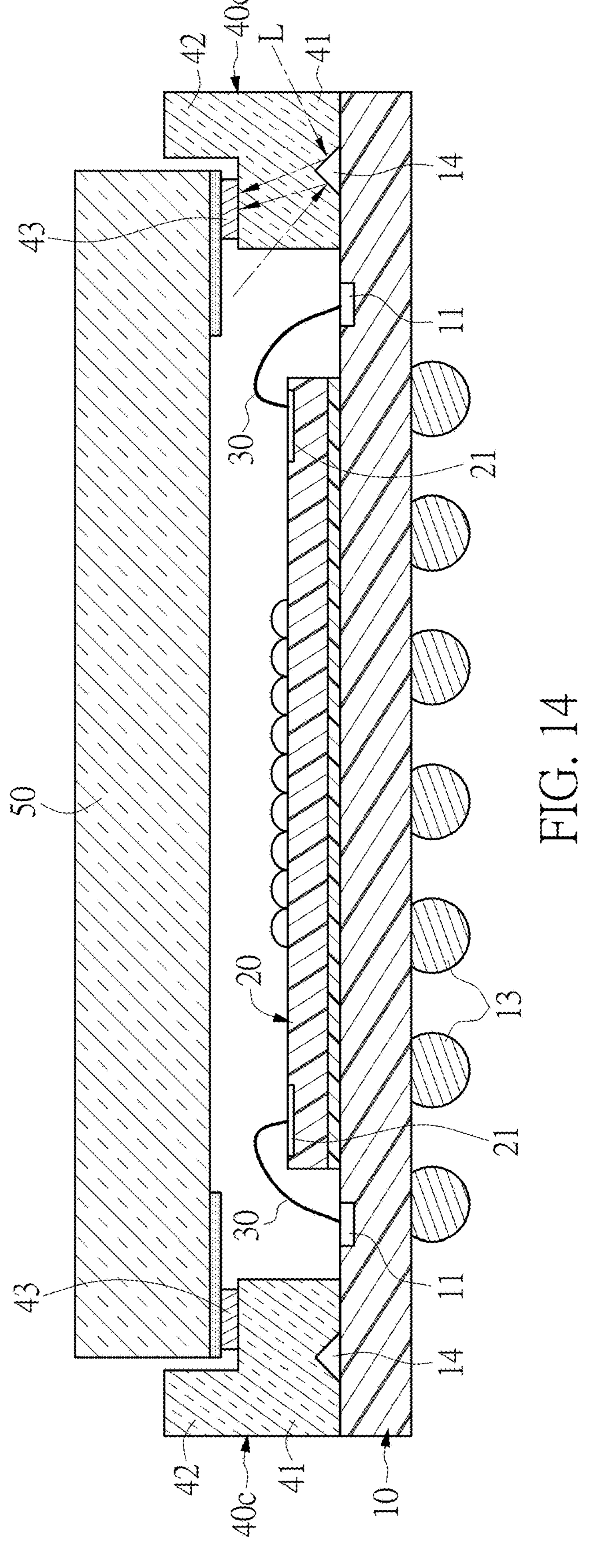
FIG. 14 is a schematic view of a reflecting member disposed on the substrate according to a fifth embodiment of the present disclosure.
Figure 15:
FIG. 15 is a schematic cross-sectional view of the chip package structure according to the fifth embodiment of the present disclosure.
Figure 15:
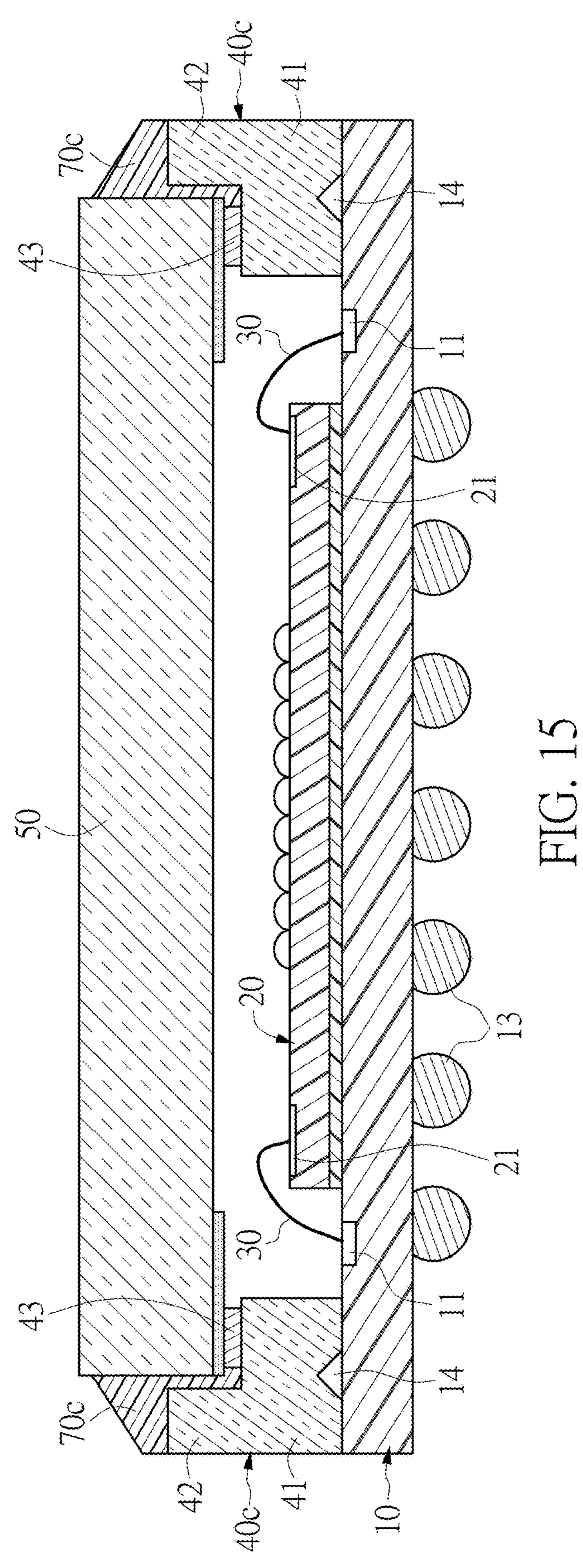

Referring to FIG. 14 to FIG. 15, the present disclosure includes at least one reflecting member 14 that is disposed on the upper surface 101 of the substrate 10. The substrate 10 may be an epoxy-based printed circuit board (PCB). However, the substrate 10 is not limited to a PCB. This embodiment can include a plurality of reflecting members 14 that are disposed between an outer edge of the substrate 10 and the substrate pads 11. In this embodiment, the reflecting members 14 can be shaped in pyramid, triangular prism, cone, or half cylinder, etc. An outer surface of the reflecting member 14 is a reflective surface. For example, the reflecting member 14 can be a metal piece, or a plastic bump with a high reflective surface. Further, the reflecting member 14 can be one piece in a surrounded shape to surround the chip 20.

A support body 40*c* is provided to surround an outer periphery of the chip 20 to form an enclosed shaped, and covers the reflecting member 14. In this embodiment, the support body 40*c* can be made of transparent material, such as epoxy molding compound (EMC). Specifically, the support body 40*c* can be formed by a molding method, and includes a base part 41 and a protruded wall 42. The base part 41 fully covers the reflecting member 14, and extended from an edge of the substrate 10 toward the substrate pads 11. In other words, the base part 41 is disposed between the edge of the substrate 10 and the substrate pads 11. The protruded wall 42 is partially protruded on a top surface 410 of the base part 41. The top surface 410 of the base part 41 is higher than the bonding wires 30. The base part 41 and the protruded wall 42 can be formed integrally. Alternatively, the protruded wall 42 can be disposed the top surface 410 of the base part 41.

A glass adhesive 43 is applied on the top surface 410 of the base part 41, and beside the protruded wall 42. A material of the glass adhesive 43 can be a photo-curable adhesive (e.g., a UV curable adhesive). Following, a package cover 50 is adhered to the top surface 410 of the base part 41 of the support body 40*c*. The package cover 50 may include, for example, transparent glass, transparent resin, or transmissive ceramic.

A solidifying process is performed in which a solidifying light beam L is emitted to the reflecting member 14, and the reflecting member 14 is utilized to reflect the solidifying light beam L to the glass adhesive 43 so as to solidify the glass adhesive 43. By this solidifying process of this embodiment, the glass adhesive 43 can be emitted uniformly, so that it can reduce a delamination problem between the package cover 50 and the support body 40*c*.

Finally, a package body 70*c* is provided between the support body 40*c* and the package cover 50, so as to form a chip package structure 100*c*. In this embodiment, the package body 70*c* is formed to cover an edge surface of the package cover 50 and a top surface of the protruded wall 42 of the support body 40*c*. The package body 70*c* can be formed with a slanted surface.

Beneficial Effects of the Embodiments

In conclusion, in the chip package structure and method for producing the same provided by the present disclosure, by virtue of "a step being implemented by performing a solidifying process in which a solidifying light beam is emitted to the mirror ink and the mirror ink is utilized to reflect the solidifying light beam to the support body to solidify the support body," a method for producing a chip package structure can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for producing a chip package structure, at least comprising:

providing a substrate;

providing a chip and placing the chip upside-down on the substrate;

forming a plurality of bonding wires coupled with a plurality of conduct portions of the chip and a plurality of substrate pads of the substrate;

providing at least one reflecting member on an upper surface of the substrate, and surrounding an outer periphery of the chip;

forming a support body on an upper surface of the substrate, the support body covering the at least one reflecting member;

disposing a glass adhesive on a top surface of the support body;

providing a package cover adhered to the support body by the glass adhesive;

performing a solidifying process in which a solidifying light beam is emitted to the reflecting member and the reflecting member is utilized to reflect the solidifying light beam to the glass adhesive to solidify the glass adhesive; and performing a packaging process in which a package body is formed to cover an edge surface of the package cover and a top part of the support body.

2. The method according to claim 1, wherein the at least one reflecting member is disposed between an outer edge of the substrate and the substrate pads.

3. The method according to claim 1, wherein the reflecting member is a metal piece or a plastic bump with a high reflective surface.

4. The method according to claim 1, wherein the reflecting member is shaped in pyramid, triangular prism, cone, or half cylinder.

5. The method according to claim 1, wherein the support body includes a base part and a protruded wall, the base part fully covers the reflecting member, the protruded wall is partially protruded on a top surface of the base part, and the glass adhesive is disposed on a top surface of the base part.

6. The method according to claim 5, wherein the base part is extended from an edge of the substrate toward the substrate pads, and is disposed between the edge of the substrate and the substrate pads.

7. The method according to claim 6, wherein the top surface of the base part is higher than the bonding wires.

8. The method according to claim 1, wherein the package body is formed to cover an edge surface of the package cover and a top surface of the protruded wall of the support body, and the package body is formed with a slanted surface.

9. A chip package structure, comprising:

a conductive substrate including:

a substrate having an upper surface; and a chip placed upside-down on the upper surface of the substrate;

a plurality of bonding wires coupled with a plurality of conduct portions of the chip and a plurality of pads of the substrate;

at least one reflecting member disposed on an upper surface of the substrate, and surrounding an outer periphery of the chip;

a support body formed on the upper surface of the substrate and covering the at least one reflecting member;

a glass adhesive disposed on a top surface of the support body; and a package cover adhered to the support body by the glass adhesive;

wherein the glass adhesive undergoes a solidifying process in which a solidifying light beam is reflected by the at least one reflecting member to the glass adhesive to solidify the glass adhesive.

10. The chip package structure according to claim 9, wherein at least one reflecting member is disposed between an outer edge of the substrate and the substrate pads.

11. The chip package structure according to claim 9, wherein the reflecting member is a metal piece or a plastic bump with a high reflective surface.

12. The chip package structure according to claim 9, wherein the reflecting member is shaped in pyramid, triangular prism, cone, or half cylinder.

13. The chip package structure according to claim 9, wherein the support body includes a base part and a protruded wall, the base part fully covers the reflecting member, the protruded wall is partially protruded on a top surface of the base part, and the glass adhesive is disposed on a top surface of the base part.

14. The chip package structure according to claim 13, wherein the base part is extended from an edge of the substrate toward the substrate pads, and is disposed between the edge of the substrate and the substrate pads.

15. The chip package structure according to claim 14, wherein the top surface of the base part is higher than the bonding wires.

16. The chip package structure according to claim 9, wherein the package body is formed to cover an edge surface of the package cover and a top surface of the protruded wall of the support body, and the package body is formed with a slanted surface.

* * * * *